(12) United States Patent
Klesyk et al.

(10) Patent No.: US 9,490,711 B2
(45) Date of Patent: Nov. 8, 2016

(54) GATE DRIVE POWER SUPPLY HAVING GATE DRIVE VOLTAGE SUPPLY TRANSFORMER CIRCUITS AND KICK STARTER CIRCUIT

(71) Applicant: Lear Corporation, Southfield, MI (US)

(72) Inventors: Krzysztof Klesyk, Novi, MI (US); Zhonghui Bing, Farmington Hills, MI (US)

(73) Assignee: Lear Corporation, Southfield, MI (US)

( * ) Notice: Subject to any disclaimer, the term of this patent is extended or adjusted under 35 U.S.C. 154(b) by 54 days.

(21) Appl. No.: 14/691,636

(22) Filed: Apr. 21, 2015

(65) Prior Publication Data

US 2015/0365001 A1 Dec. 17, 2015

Related U.S. Application Data

(60) Provisional application No. 62/011,139, filed on Jun. 12, 2014.

(51) Int. Cl.
*H02M 1/08* (2006.01)
*H02M 3/335* (2006.01)
*H02M 7/5387* (2007.01)
*H03K 17/14* (2006.01)
*H03K 17/691* (2006.01)

(52) U.S. Cl.
CPC ........... *H02M 3/33507* (2013.01); *H02M 1/08* (2013.01); *H02M 7/5387* (2013.01); *H03K 17/145* (2013.01); *H03K 17/691* (2013.01); *H03K 2217/0081* (2013.01)

(58) Field of Classification Search
CPC ............................................ H02M 1/08–1/096
See application file for complete search history.

(56) References Cited

U.S. PATENT DOCUMENTS

| | | | |
|---|---|---|---|
| 5,483,436 A | | 1/1996 | Brown et al. |
| 5,680,015 A | * | 10/1997 | Bernitz ............... H05B 41/2928 315/291 |
| 7,012,822 B2 | | 3/2006 | Zhu et al. |
| 2002/0158606 A1 | | 10/2002 | King |
| 2007/0063661 A1 | * | 3/2007 | Galli ........................ H02M 1/32 318/109 |
| 2010/0302820 A1 | * | 12/2010 | Nakamura ............... H02M 7/48 363/126 |
| 2011/0085363 A1 | | 4/2011 | Gupta et al. |
| 2013/0307332 A1 | * | 11/2013 | Takezawa ............... H02M 1/44 307/17 |

FOREIGN PATENT DOCUMENTS

EP 0483894 A1 5/1992

* cited by examiner

*Primary Examiner* — Harry Behm
*Assistant Examiner* — Peter Novak
(74) *Attorney, Agent, or Firm* — Brooks Kushman P.C.

(57) ABSTRACT

A gate drive power supply (GDPS) system includes a voltage boost stage configured to boost an input voltage into a boost voltage and an inverter stage configured to invert the boost voltage into an AC voltage. The GDPS system further includes gate drive voltage supply circuits transformer coupled to the inverter stage to receive an AC output based on the AC voltage and configured to convert the AC output into DC supply voltages for gate drives.

14 Claims, 4 Drawing Sheets

GATE DRIVE POWER SUPPLY HAVING GATE DRIVE VOLTAGE SUPPLY TRANSFORMER CIRCUITS AND KICK STARTER CIRCUIT

CROSS-REFERENCE TO RELATED APPLICATIONS

This application claims the benefit of U.S. Provisional Application No. 62/011,139, filed Jun. 12, 2014, the disclosure of which is hereby incorporated in its entirety by reference herein.

TECHNICAL FIELD

The present invention relates to a gate drive power supply (GDPS) for an inverter.

BACKGROUND

An inverter inverts a DC input into an AC output. High power switches (i.e., transistors) of the inverter are switched on and off to invert the DC input into the AC output. The switches switch on and off in response to gate drive signals. The gate drive signals have relatively precise current and voltage values for the switches to switch properly. Gate drives of the inverter provide the gate drive signals to the switches. The gate drives require precisely regulated supply power in order to generate the requisite gate drive signals.

SUMMARY

A gate drive power supply system (GDPS) includes a voltage boost stage configured to boost an input voltage into a boost voltage and an inverter stage configured to invert the boost voltage into an AC voltage. The GDPS further includes gate drive voltage supply circuits transformer coupled to the inverter stage to receive an AC output based on the AC voltage and configured to convert the AC output into DC supply voltages for gate drives.

The GDPS system may further include an additional voltage supply circuit transformer coupled to the inverter stage to receive another AC output based on the AC voltage and configured to convert the other AC output into a DC supply voltage for a load other than a gate drive.

The GDPS system may further include a gate driver controller configured to control operation of the inverter stage in inverting the boost voltage into the AC voltage, and a gate driver controller voltage supply circuit transformer coupled to the inverter stage to receive another AC output based on the AC voltage and configured to convert the other AC output into a DC supply voltage for the gate driver controller.

The GDPS system may further include a kick starter circuit configured to supply the gate driver controller with energy while the DC supply voltage from the gate driver controller voltage supply circuit is insufficient for powering the gate driver controller. The kick starter circuit may be powered by the boost voltage.

The GDPS system may further include a voltage boost controller configured to control operation of the voltage boost stage in boosting the input voltage into the boost voltage. The voltage boost controller may be powered by the boost voltage.

A GDPS method includes boosting an input voltage into a boost voltage and inverting, by a half-bridge inverter stage, the boost voltage into an AC voltage. The method further includes receiving an AC output based on the AC voltage by gate drive voltage supply circuits transformer coupled to the inverter stage and converting, by the gate drive voltage supply circuits, the AC output into DC supply voltages for gate drives.

The method may further include receiving another AC output based on the AC voltage by an additional voltage supply circuit transformer coupled to the inverter stage and converting, by the additional voltage supply circuit, the other AC output into a DC supply voltage for a load other than a gate drive.

The method may further include controlling, by a gate driver controller, operation of the inverter stage in inverting the boost voltage into the AC voltage, receiving another AC output based on the AC voltage by a gate driver controller voltage supply circuit transformer coupled to the inverter stage, and converting, by the gate driver controller voltage supply circuit, the other AC output into a DC supply voltage for the gate driver controller.

The method may further include supplying, by a kick starter circuit powered by the boost voltage, the gate driver controller with energy while the DC supply voltage from the gate driver controller voltage supply circuit is insufficient for powering the gate driver controller.

The method may further include controlling, by a voltage boost controller powered by the boost voltage, operation of the voltage boost stage in boosting the input voltage into the boost voltage.

A system includes an inverter having gate drives and a GDPS. This GDPS includes a voltage boost stage configured to boost a DC input voltage from an auxiliary battery into a DC boost voltage and a half-bridge inverter stage configured to invert the DC boost voltage into an AC voltage. This GDPS further includes gate drive voltage supply circuits transformer coupled to the inverter stage to receive an AC output based on the AC voltage and configured to convert the AC output into DC supply voltages for the gate drives.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
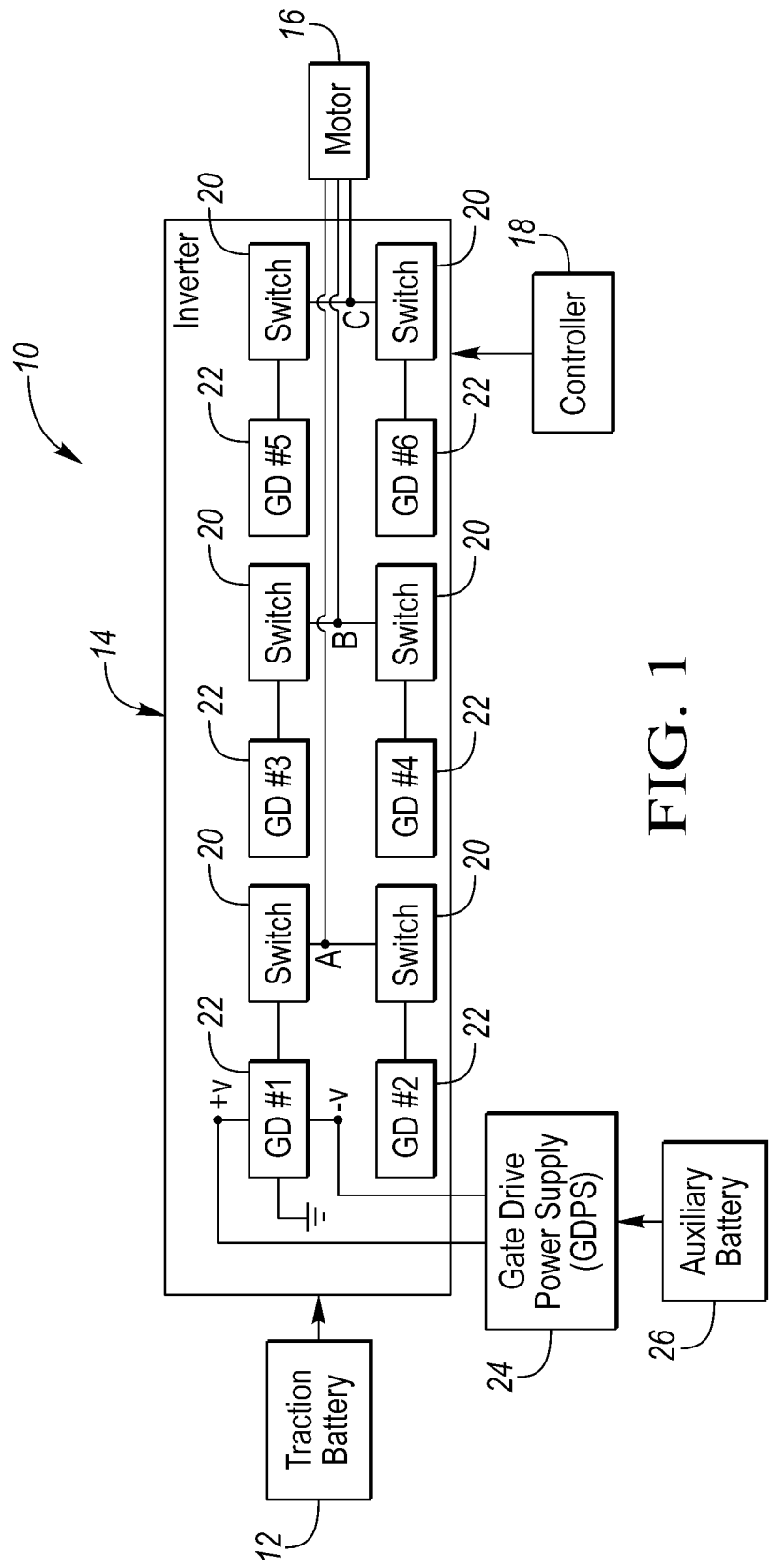
FIG. 1 illustrates a block diagram of an electric vehicle powertrain having a gate drive power supply (GDPS)

Referring now to FIG. 1, a block diagram of an electric vehicle powertrain 10 in accordance with an embodiment of the present invention is shown. Powertrain 10 is, for example, the powertrain of a hybrid or plug-in hybrid electric vehicle in which case the powertrain further includes an engine. As another example, powertrain 10 is the powertrain of a battery electric vehicle in which case the powertrain lacks an engine.

Powertrain 10 includes a high-voltage traction battery 12, a traction inverter 14, and an electric traction motor 16. Inverter 14 inverts DC electrical energy from battery 12 into AC electrical energy for motor 16. Motor 16 consumes the AC energy to produce torque for the vehicle drive wheels (not shown) to propel the vehicle. The AC energy is a frequency controlled, three-phase AC signal, for example.

As an example, inverter 14 is a three-phase inverter using semiconductor switches (i.e., transistors) 20 for inverting the DC input into the AC output. Switches 20 may be insulated gate bipolar transistors (IGBT). For lower power applications, switches 20 may be MOSFETs. Switches 20 are switched on and off for inverter 14 to invert the DC input into the AC output.

Inverter 14 is formed of a parallel circuit including one pair of switches 20 in series (Phase A), a second pair of switches 20 in series (Phase B), and a third pair of switches 20 in series (Phase C). As such, inverter 14 includes six switches 20. Inverter 14 generates the three-phase AC output from three currents output from connection points of the respective pairs of switches as shown in FIG. 1. In this way, inverter 14 inverts the DC energy from battery 12 into the three-phase AC energy for motor 16.

Inverter 14 further includes a plurality of gate drives (GDs) 22. Gate drives 22 are associated with switches 20. For example, as shown in FIG. 1, gate drives 22 and switches 20 are paired with one another. In this case, inverter 14 includes six gate drives 22 as shown in FIG. 1. In other cases, a gate drive 22 is associated with more than one switch 20.

Switches 20 switch on and off in response to gate drive signals. Gate drives 22 provide the gate drive signals to switches 20, in particular to the gates of the switches. The gate drive signals have to be of relatively precise current and voltage values for switches 20 to switch properly. Gate drives 22 require precisely regulated supply power in order to generate the requisite gate drive signals.

As such, proper operation of inverter 14 requires that a well-regulated DC supply voltage be provided to gate drives 22 for the gate drives to provide the requisite gate drive signals to switches 20. The DC supply voltage provided to gate drives 22 has to have voltage amplitudes within a predetermined threshold of a nominal value. For example, the nominal supply voltage for gate drives 22 is about 25.0V and inverter 14 may shut down when this supply voltage drops below 23.0V. Such shutdown is necessary as gate drives 22 will not be able to produce gate drive signals of the requisite type and the response to switches 20 to gate drive signals falling outside of an allowable tolerance can be erratic.

Powertrain 10 further includes a gate drive power supply (GDPS) 24. GDPS 24 is configured to provide the well-regulated DC supply voltage to gate drives 22. GDPS 24 generates the DC supply voltage for gate drives 22 using electrical energy from a low voltage DC auxiliary battery 26 (e.g., 12V). The DC supply voltage generated by GDPS 24 for gate drives 22 is independent of the DC input power to inverter 14 which the inverter inverts into AC power for motor 16.

The DC supply voltage provided by GDPS 24 includes a plurality of gate drive DC voltage signals for respective ones of gate drives 22. For instance, GDPS 24 generates a first gate drive DC voltage for a first one of gate drives 22, a second gate drive DC voltage for a second one of gate drives 22, etc. As such, in the arrangement of inverter 14 as shown in FIG. 1, GDPS 24 generates six gate drive DC voltage signals for the six gate drives 22 of inverter 14.

In this embodiment, the gate drive DC voltage signals generated by GDPS 24 have the same voltage characteristics. For instance, each gate drive DC voltage signal is about a 24.5V voltage signal split into a +15.5V potential and a −9.0V potential. As such, in this case, GDPS 24 is configured to generate six isolated 23V to 25V power supplies each split into a +15.5V potential and a −9.0V potential. Of course, GDPS 24 can generate gate drive DC voltage signals having other voltage characteristics such as different voltage values and different potentials.

In an exemplary arrangement, inverter 14 includes two sets of switches 20 and gate drives 22 arranged in parallel. Arranging two or more sets in parallel is designed to place the output stages in parallel to thereby achieve higher power throughput. In FIG. 1, one set of six switches 20 each associated with a respective gate drive 22 is shown. The exemplary arrangement therefore includes twelve switches 20 and twelve gate drives 22. GDPS 24 is configured to generate twelve gate drive DC voltage signals for these twelve gate drives 22 using electrical energy from auxiliary battery 26. As such, GDPS 24 is configured to generate twelve isolated 23V to 25V power supplies each split into a +15.5V potential and a −9.0V potential.

As described herein, GDPS 24 is further configured to generate additional DC voltage signals using the electrical energy from auxiliary battery 26. For instance, GDPS 24 is configured to generate three other isolated 15V power supplies. For example, GDPS 24 is configured to generate a first 15V DC voltage signal for a resolver (not shown) associated with motor 16, a second 15V DC voltage signal for a first isolation monitor (not shown) associated with a first plane of inverter 14, and a third 15V DC voltage signal for a second isolation monitor (not shown) associated with a second plane of inverter 14.

Powertrain 10 further includes a controller 18. Controller 18 is configured to, among other functions, control inverter 14 to control the DC to AC conversion performed by the inverter. In this regard, controller 18 is configured to control the switching of switches 20 according to a predetermined schedule to cause the DC input to be inverted into the AC output.

Figure 2:
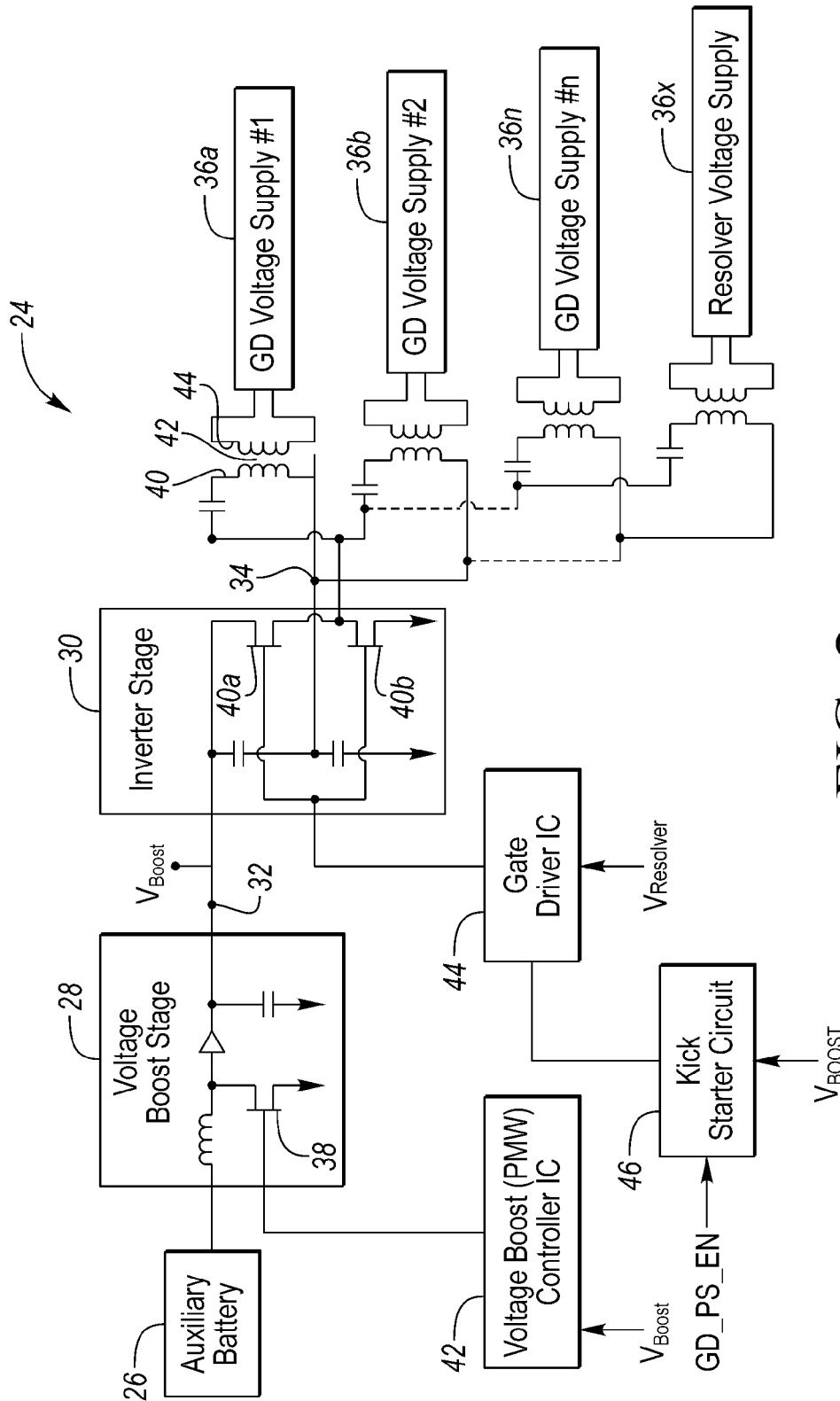
FIG. 2 illustrates a schematic diagram of the GDPS.

Referring now to FIG. 2, a schematic diagram of GDPS 24 is shown. Again, GDPS 24 generates the gate drive DC voltage signals and the additional DC voltage signals using electrical energy from auxiliary battery 26. GDPS 24 includes a two stage converter to generate the DC voltage signals. A first stage of the converter is a voltage boost stage 28 and a second stage of the converter is an inverter stage 30. Voltage boost stage 28 boosts the variable, relatively low DC voltage (e.g., 12V) from auxiliary battery 26 into a regulated substantially higher DC boost voltage ($V_{Boost}$) (e.g., 45V). Inverter stage 30 inverts DC boost voltage 32 to an AC voltage 34.

GDPS 24 further includes a plurality of voltage supply circuits 36. As an example, voltage supply circuits 36 include a plurality of gate drive voltage supply circuits 36a, 36b, and 36n and a resolver voltage supply circuit 36x. Gate drive voltage supply circuits 36a, 36b, and 36n are respectively associated with gate drives 22 and are to provide gate drive DC voltage signals to their corresponding gate drives 22. Resolver voltage supply circuit 36x is associated with a resolver of motor 16 and is to provide a DC voltage signal for the resolver.

Figure 3:
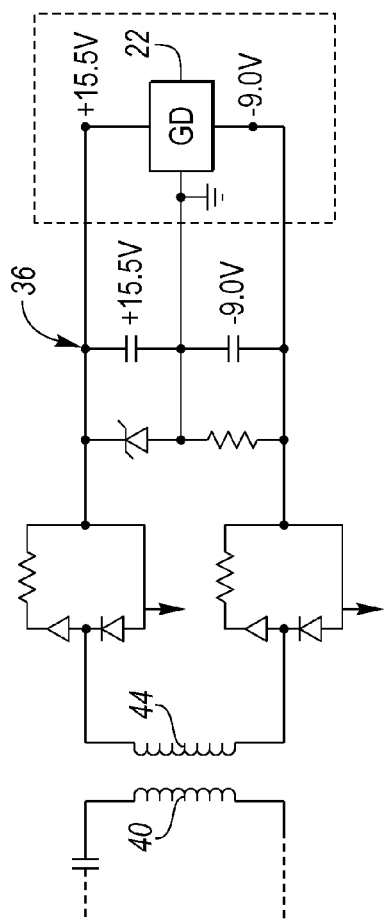
FIG. 3 illustrates a schematic diagram of a gate drive voltage supply circuit of the GDPS.

AC voltage 34 is individually transformer coupled to each of voltage supply circuits 36. In particular, for each voltage supply circuit 36, a primary winding 40 of a transformer 42 is coupled between the two legs of inverter stage 30. A secondary winding 44 of transformer 42 provides the AC output from secondary winding 44 to the voltage supply circuit 36. The voltage supply circuit 36 rectifies this AC output to generate therefrom a DC supply voltage. For instance, gate drive voltage supply circuit 36a rectifies the AC output to generate therefrom a gate drive DC voltage signal for the corresponding gate drive 22; gate drive voltage supply circuit 36b rectifies the AC output to generate therefrom a gate drive DC voltage signal for the corresponding gate drive 22; etc. Again, as an example, each gate drive DC voltage signal is about a 25.0V DC voltage signal split into a +15.5V potential and a −9.0V potential. A schematic diagram of one of gate drive voltage supply circuits 36 is shown in FIG. 3.

Likewise, resolver voltage supply circuit 36x rectifies the AC output to generate therefrom the DC supply voltage for the resolver. Again, as an example, the DC supply voltage generated by resolver voltage supply circuit 36x is a 15V DC voltage signal.

Figure 4:
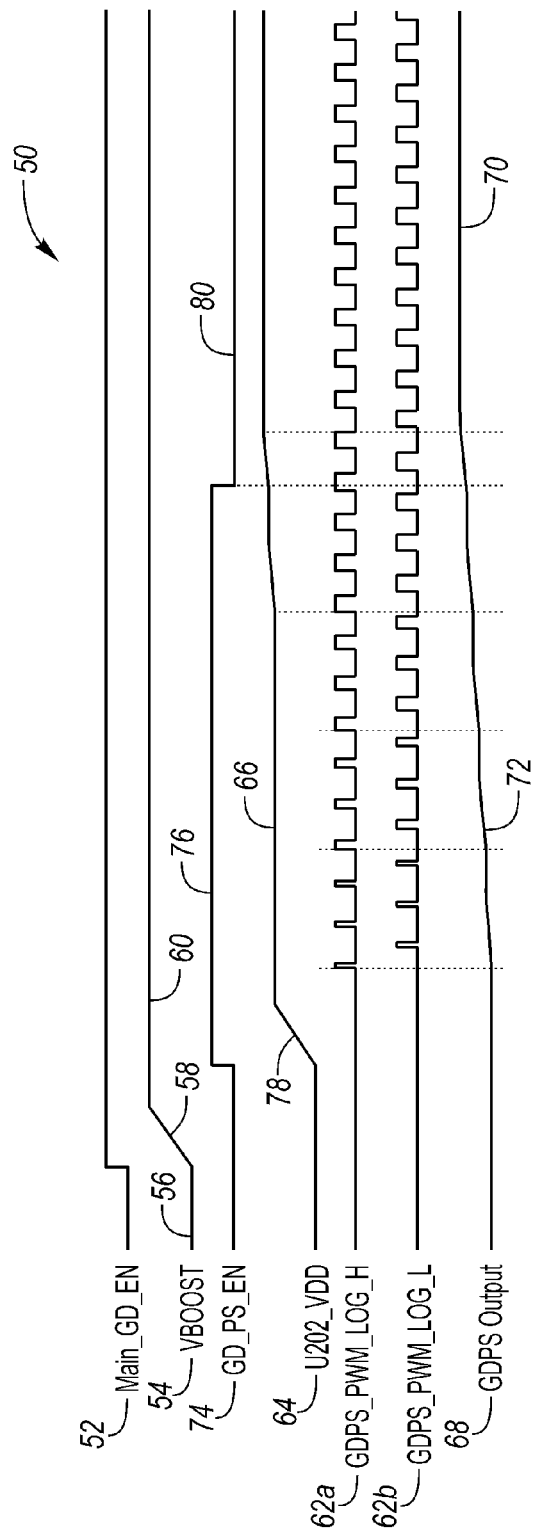
FIG. 4 illustrates a timing diagram of the startup sequencing of the GDPS.

The configuration and operation of GDPS 24 for generating the plurality of voltage supplies (i.e., the gate drive and additional voltage signals) using electrical energy from auxiliary battery 26 will be described in conjunction with FIG. 4. FIG. 4 illustrates a timing diagram 50 of the startup sequencing and steady-state operation of GDPS 24.

As shown in FIG. 2, voltage boost stage 28 of GDPS 24 includes a switch 38 in the form of a transistor for carrying out the voltage boost function. Inverter stage 30 of GDPS 24 is a half-bridge inverter including a pair of switches 40a and 40b in the form of transistors for carrying out the inverter function. GDPS 24 further includes a voltage boost controller integrated circuit (IC) 42, a gate driver integrated circuit (GDIC) 44, and a kick starter circuit 46. Voltage boost controller 42, GDIC 44, and kick starter circuit 46 are controllers (e.g., micro-controllers) ("controllers"). Any or all of voltage boost controller 42, GDIC 44, and kick starter circuit 46 may be part of the same controller. As explained in greater detail below, in this exemplary embodiment, voltage boost controller 42 and GDIC 44 are pulse width modulated (PWM) controllers.

Voltage boost controller 42 is configured to control the switching of switch 38 of voltage boost stage 28 to thereby control the boosting of the DC voltage from auxiliary battery 26 into DC boost voltage 32. Voltage boost controller 42 controls the switching of switch 38 using a pulse width modulated (PWM) control signal. Voltage boost controller 42 senses the voltage value of DC boost voltage 32 output from voltage boost stage 28 as feedback information for controlling the switching of switch 38. Voltage boost controller 42 is powered by DC boost voltage 32.

Voltage boost controller 42 controls voltage boost stage 28 to boost the DC voltage from auxiliary battery 26 into DC boost voltage 32 while the voltage boost controller is enabled. Voltage boost controller 42 is enabled while a Main_GD_EN control signal 52, shown in FIG. 4, provided to voltage boost controller 42 is high. Voltage boost controller 42 begins its control boost operation of voltage boost stage 28 upon Main_GD_EN control signal 52 turning from low to high. The voltage of DC boost voltage 32 is indicated in FIG. 4 as VBOOST signal 54. As indicated by portion 56 of VBOOST signal 54, the value of DC boost voltage 32 is at a low value (e.g., the same value as the voltage of auxiliary battery 26) prior to voltage boost controller 42 being turned on to control the boost operation of voltage boost stage 28. Upon voltage boost controller 42 operating to boost the voltage from auxiliary battery 26 into DC boost voltage 32, the value of DC boost voltage 32 rises as indicated by portion 58 of VBOOST signal 54. The value of DC boost voltage 32 eventually rises to a targeted high value (e.g., 45V) and stays at this high value during operation of voltage boost controller 42 as indicated by portion 60 of VBOOST signal 54.

GDIC 44 controls the switching of switches 40a and 40b of inverter stage 30 to thereby control the inverting of DC boost voltage 32 into AC voltage 34. GDIC 44 controls the switching of switch 40a using a PWM control signal (i.e., GDPS_PWM_LOG_H control signal 62a shown in FIG. 4) and controls the switching of switch 40b using a complementary PWM control signal (i.e., GDPS_PWM_LOG_L control signal 62b shown in FIG. 4).

GDIC 44 requires to be supplied with at least a minimum amount of energy in order to be able to control the switching of switches 40a and 40b properly. The amount of energy supplied to GDIC 44 is indicated by U202_VDD signal 64 shown in FIG. 4. As seen from a comparison between U202_VDD signal 64 and PWM control signals 62a and 62b, GDIC 44 does not start to generate PWM control signals 62a and 62b until the energy supplied to GDIC 44 reaches a sufficient amount indicated by portion 66 of U202_VDD signal 64. Once this amount of supply energy to GDIC 44 is obtained and maintained, GDIC 44 generates PWM control signals 62a and 62b with increasing duty cycles over time until a 50% duty cycle is obtained as shown in FIG. 4. GDIC 44 continues generating the complementary PWM control cycles with the 50% duty cycle as long as GDIC 44 is supplied with the sufficient amount of energy during system operation. Inverter stage 30 properly and efficiently inverts DC boost voltage 32 into the desired AC voltage 34 in response to switches 40a and 40b receiving complementary PWM control signals 62a and 62b having the 50% duty cycle.

As noted above, voltage supply circuits 36 generate DC voltage signals from AC voltage 34. The DC voltage signal generated by each of voltage supply circuits 36 is depicted in FIG. 4 as a generalized GDPS output signal 68. As shown by a comparison of GDPS output signal 68 and PWM control signals 62a and 62b, the DC voltage signals generated by voltage supply circuits 36 rise as the duty rate of PWM control signals 62a and 62b rises. The generated DC voltage signals rise to and maintain their desired values while PWM control signals 62a and 62b have the 50% duty cycle as indicated by portion 70 of GDPS output 68.

For instance, the gate drive DC voltage signal generated by voltage supply circuit 36a is the requisite 25.0V DC voltage signal while the complementary PWM control signals 62a and 62b provided switches 40a and 40b of inverter stage 30 have the 50% duty cycle. The gate drive DC voltage signal being at the requisite voltage is indicated by portion 70 of GDPS output 68. Likewise, the DC voltage signal generated by resolver voltage supply circuit 36x is lower than the desired 15V DC supply voltage until the complementary PWM control signals 62a and 62b have the 50% duty cycle. The DC voltage signal being less than its desired 15V voltage is indicated by portion 72 of GDPS output 68. Once steady state operation of inverter stage 30 is reached, resolver voltage supply circuit 36x generates the 15V DC supply voltage which is indicated by portion 70 of GDPS output 68.

As described, GDIC 44 requires to be supplied with a proper amount of energy (indicated by portion 66 of U202_VDD signal 64) to operate in controlling inverter stage 30. GDPS 24 is configured to ensure that GDIC 44 is supplied with the proper amount of energy. In this regard, GDIC 44 receives a supply voltage from one of voltage supply circuits 36 for powering the GDIC. For instance, GDIC 44 requires a 12V DC supply voltage. In one variation, GDIC 44 receives a supply voltage from resolver voltage supply circuit 36x for powering the GDIC. As noted above, the supply voltage from resolver voltage supply circuit 36x is a 15V DC voltage. In this case, GDIC 44 is powered by the resolver power supply which can sufficiently provide the power required by GDIC 44 during steady state operation of inverter stage 30. As described, during steady state operation of inverter stage 30 the voltage of voltage signal generated by resolver voltage supply circuit 36x is at least 12V DC. As further described, steady state operation of inverter stage 30 is reached once voltage boost stage 28 has enough time to fully generate DC boost voltage 32 (e.g., 45V) from the DC voltage (e.g., 12V) of auxiliary battery 26 (i.e., during portion 60 of VBOOST signal 54) and inverter stage 30 is able to generate AC voltage 34 from the fully generated DC boost voltage 32 (i.e., during portion 70 of GDPS output 68).

Put another way, upon startup, a transient period of time exists until steady state is reached. During steady state the supply voltage from resolver voltage supply circuit 36x is a 15V DC voltage. However, during the transient period of time (or startup period), the supply voltage from resolver voltage supply circuit 36x is not yet the 15V DC voltage (i.e., during portion 72 of GDPS output 68). As such, during the startup period, the supply voltage from resolver voltage supply circuit 36x is not sufficient for powering GDIC 44.

Kick starter circuit 46 solves this problem by supplying the requisite DC supply voltage (i.e., the 12V DC voltage signal) to GDIC 44 during the start-up period. Kick starter circuit 46 is powered by DC boost voltage 32 for generating the DC supply voltage for GDIC 44 during the startup period. Kick starter circuit 46 provides the DC supply voltage to GDIC 44 while a GD_PS_EN control signal 74 provided to kick starter circuit 46 is set high. Control signal 74 is set high as indicated by portion 76 of control signal 74 while the supply voltage from resolver voltage supply circuit 36x is less than the requisite 12V DC voltage (i.e., during portion 72 of GDPS output 68).

As such, kick starter circuit 46 provides the supply voltage to GDIC 44 while the supply voltage from resolver voltage supply circuit 36x is less than the voltage required by the GDIC. During a transient period of time upon kick starter circuit 46 being enabled the supply voltage to GDIC 44 rises as indicated by portion 78 of U202_VDD signal 64. After this transient period of time kick starter circuit 46 supplies the requisite 12V DC voltage to GDIC 44 as indicated by portion 66 of U202_VDD signal.

Kick starter circuit control signal 74 is set low as indicated by portion 80 of control signal 74 while the supply voltage from resolver voltage supply circuit 36x is sufficient for supplying GDIC 44 (i.e., during portion 70 of GDPS output 68). Kick starter circuit 46 does not provide a supply voltage to GDIC 44 during this time while control signal 74 is set low. Resolver voltage supply circuit 36x instead provides the supply voltage to GDIC 44 as the voltage output of the resolver voltage supply circuit 36x is at its full value as indicated by portion 70 of GDPS output 68.

As described, voltage boost controller 42 controls voltage boost stage 28 to boost the DC voltage from auxiliary battery 26 into DC boost voltage 32 from which the gate drive and additional supply voltages are generated. Voltage boost controller 42 controls the switching of switch 38 using a PWM control signal for voltage boost stage 28 to generate DC boost voltage 32. At certain times, the DC voltage from auxiliary battery 26 may drop from its normal level (e.g., 12V) down to a lower level (e.g., 8V) as a result of battery 26 being discharged.

Voltage boost controller 42 handles such conditions by monitoring the value of the voltage of DC boost voltage 32. While DC boost voltage 32 is low, such as a result of the input voltage from auxiliary battery 26 being low, voltage boost controller 46 make appropriate accommodations to cause DC boost voltage 32 to rise to the appropriate voltage level. In particular, voltage boost controller 46 modifies the switching of switch 38 of voltage boost stage 28 to compensate for the 12V auxiliary battery 26 providing an 8V DC input voltage. The switching modification of switch 38 cause voltage boost stage 28 to boost the 8V DC input voltage into DC boost voltage 32 at the proper voltage level.

Figure 5:
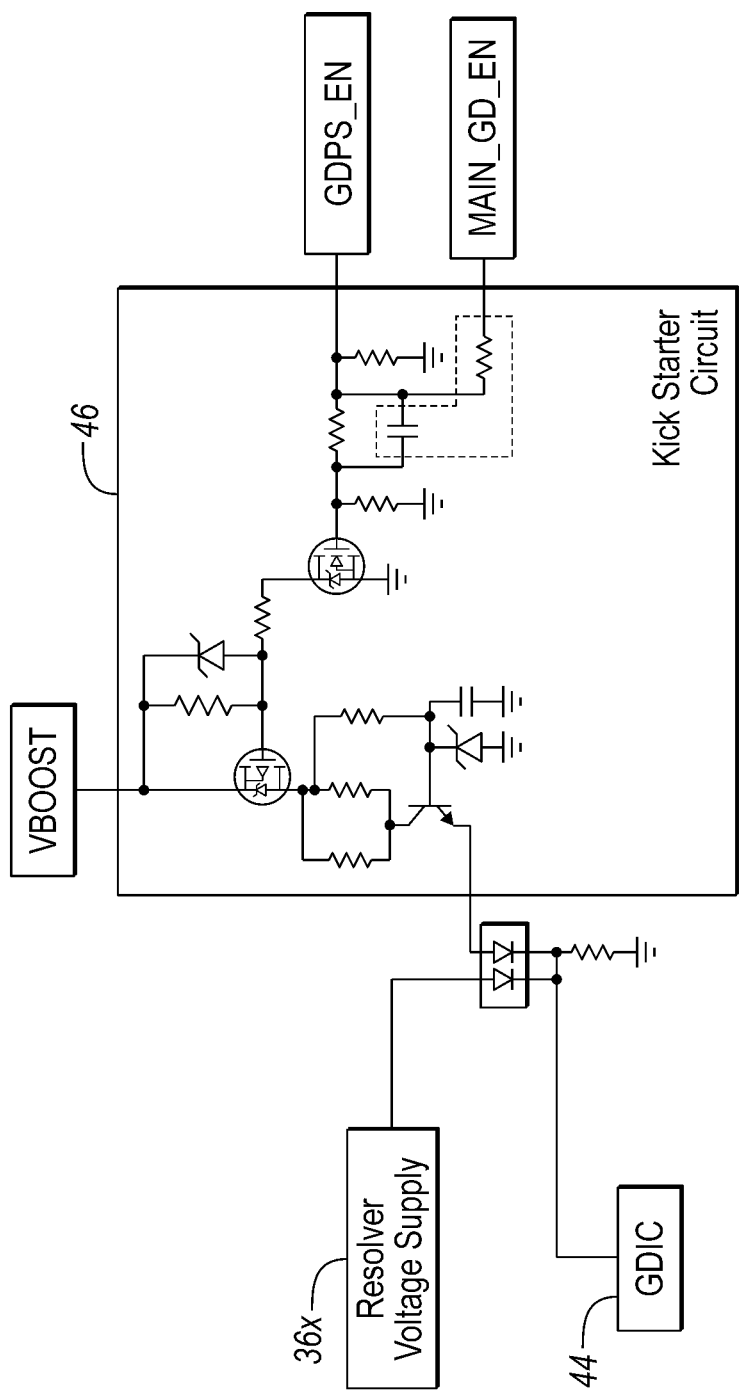
FIG. 5 illustrates a highly detailed schematic of a kick starter circuit of the GDPS.

As an example, voltage boost controller 46 includes a LM3478 electronic chip; GDIC 44 includes a UCC27201QDDARQ1 electronic chip; and kick starter circuit 46 includes a transistor arrangement. FIG. 5 illustrates a highly detailed schematic of kick starter circuit 46.

As described, GDPS 24 provides the following features. GDPS 24 generates a regulated (i.e., 45V) voltage boost supply. GDPS 24 enables both gate drive and resolver operations down to 8V battery. GDPS 24 generates multiple (e.g., twelve) isolated 23V to 25V power supplies split into 15.5V positive and 9.0V negative. GDPS 24 generates three isolated 15V supplies using three additional transformers. GDPS 24 generates the power supplies with the use of a microcontroller complementary pair PWM. GPDS 24 enables sequencing, cost/space savings, and additional flexibility. The transistor Q210 and its associated circuitry (FIG. 5) of kick starter circuit 46 allows for under-voltage operation, brownout protection, timed start up pulse from VBOOST, elimination of boost startup resistance power dissipation, and provision of crude linear regulation to GDIC 44 under various operating conditions.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A gate drive power supply system comprising:
    a voltage boost stage configured to boost an input voltage into a boost voltage;
    an inverter stage configured to invert the boost voltage into an AC voltage;
    a plurality of gate drive voltage supply circuits transformer coupled to the inverter stage to receive an AC output based on the AC voltage and configured to convert the AC output into DC supply voltages for gate drives;
    a gate driver controller configured to control operation of the inverter stage in inverting the boost voltage into the AC voltage;
    a gate driver controller voltage supply circuit transformer coupled to the inverter stage to receive another AC output based on the AC voltage and configured to convert the other AC output into a DC supply voltage for the gate driver controller; and a kick starter circuit configured to supply the gate driver controller with energy while the DC supply voltage from the gate driver controller voltage supply circuit is insufficient for powering the gate driver controller.

2. The system of claim 1 further comprising:
an additional voltage supply circuit transformer coupled to the inverter stage to receive another AC output based on the AC voltage and configured to convert the other AC output into a DC supply voltage for a load other than a gate drive.

3. The system of claim 1 wherein:
the kick starter circuit is powered by the boost voltage.

4. The system of claim 1 wherein:
the inverter stage includes a pair of switches; and
the gate driver controller controls operation of the inverter stage in inverting the boost voltage into the AC voltage by switching the switches on and off using pulse width modulated (PWM) control signals.

5. The system of claim 4 wherein:
the DC supply voltage from the gate driver controller voltage supply circuit is insufficient for powering the gate driver controller until the gate driver controller switches the switches of the inverter stage on and off in accordance with complementary pair PWM control signals having a 50% duty cycle.

6. The system of claim 4 wherein:
the inverter stage is a half-bridge inverter.

7. The system of claim 1 further comprising:
a voltage boost controller configured to control operation of the voltage boost stage in boosting the input voltage into the boost voltage, wherein the voltage boost controller is powered by the boost voltage.

8. The system of claim 7 wherein:
the voltage boost stage includes a switch; and
the voltage boost controller controls operation of the voltage boost stage in boosting the input voltage into the boost voltage switching the switch using a pulse width modulated (PWM) control signal dependent on a voltage value of the input voltage.

9. A gate drive power supply method comprising:
boosting an input voltage into a boost voltage;
inverting, by a half-bridge inverter stage, the boost voltage into an AC voltage;
receiving an AC output based on the AC voltage by a plurality of gate drive voltage supply circuits transformer coupled to the inverter stage;
converting, by the gate drive voltage supply circuits, the AC output into DC supply voltages for gate drives;
controlling, by a gate driver controller, operation of the inverter stage in inverting the boost voltage into the AC voltage;
receiving another AC output based on the AC voltage by a gate driver controller voltage supply circuit transformer coupled to the inverter stage;
converting, by the gate driver controller voltage supply circuit, the other AC output into a DC supply voltage for the gate driver controller; and
supplying, by a kick starter circuit powered by the boost voltage, the gate driver controller with energy while the DC supply voltage from the gate driver controller voltage supply circuit is insufficient for powering the gate driver controller.

10. The method of claim 9 further comprising:
receiving another AC output based on the AC voltage by an additional voltage supply circuit transformer coupled to the inverter stage; and
converting, by the additional voltage supply circuit, the other AC output into a DC supply voltage for a load other than a gate drive.

11. The method of claim 9 further comprising:
controlling, by a voltage boost controller powered by the boost voltage, operation of the voltage boost stage in boosting the input voltage into the boost voltage.

12. A system comprising:
an inverter having a plurality of gate drives;
a gate drive power supply (GDPS) including a voltage boost stage configured to boost a DC input voltage from an auxiliary battery into a DC boost voltage, a half-bridge inverter stage configured to invert the DC boost voltage into an AC voltage, and a plurality of gate drive voltage supply circuits transformer coupled to the inverter stage to receive an AC output based on the AC voltage and configured to convert the AC output into DC supply voltages for the gate drives;
wherein the GDPS further includes a gate driver controller configured to control operation of the inverter stage in inverting the DC boost voltage into the AC voltage and a gate driver controller voltage supply circuit transformer coupled to the inverter stage to receive another AC output based on the AC voltage and configured to convert the other AC output into a DC supply voltage for the gate driver controller; and
wherein the GDPS further includes a kick starter circuit powered by the boost voltage and configured to supply the gate driver controller with energy while the DC supply voltage from the gate driver controller voltage supply circuit is insufficient for powering the gate driver controller.

13. The system of claim 12 wherein:
the GDPS further includes an additional voltage supply circuit transformer coupled to the inverter stage to receive another AC output based on the AC voltage and configured to convert the other AC output into a DC supply voltage for a load other than the inverter.

14. The system of claim 12 wherein:
the GDPS further includes a voltage boost controller powered by the boost voltage and configured to control operation of the voltage boost stage in boosting the input voltage into the boost voltage.

* * * * *